(12) United States Patent
Lim et al.

(10) Patent No.: US 7,336,780 B2
(45) Date of Patent: Feb. 26, 2008

(54) DIFFERENTIAL SIGNALING TRANSMISSION CIRCUIT

(75) Inventors: Shao-Jen Lim, Sunnyvale, CA (US); Sen-Jung Wei, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 649 days.

(21) Appl. No.: 10/630,924

(22) Filed: Jul. 31, 2003

(65) Prior Publication Data

US 2004/0136519 A1 Jul. 15, 2004

Related U.S. Application Data

(60) Provisional application No. 60/399,711, filed on Aug. 1, 2002.

(51) Int. Cl.
*H04M 1/00* (2006.01)
*H04M 9/00* (2006.01)

(52) U.S. Cl. ............... 379/388.06; 327/423; 327/538; 326/312

(58) Field of Classification Search ........... 379/388.06; 327/312; 326/26–28
See application file for complete search history.

(56) References Cited

U.S. PATENT DOCUMENTS

| 5,656,952 A * | 8/1997 | McCall et al. ............... 326/82 |
| 6,307,402 B1* | 10/2001 | Hedberg ...................... 326/86 |
| 2002/0171402 A1* | 11/2002 | Beck .......................... 323/220 |
| 2003/0210074 A1* | 11/2003 | Morgan et al. ............... 326/83 |

* cited by examiner

*Primary Examiner*—Ramnandan Singh
(74) *Attorney, Agent, or Firm*—Akin, Gump et al.

(57) ABSTRACT

The application discloses driver circuits including a current source, a current sink, and a current steering circuit configured to provide current to a load. The current sink is configured to be controlled according to a regulated voltage. Signal generator circuits are also disclosed.

18 Claims, 15 Drawing Sheets

US 7,336,780 B2

DIFFERENTIAL SIGNALING TRANSMISSION CIRCUIT

RELATED APPLICATIONS

This application claims priority to U.S. Provisional Patent Application No. 60/399,711, filed Aug. 1, 2002 and entitled "LOW VOLTAGE DIFFERENTIAL SIGNALING DRIVERS WITH IMPROVED MATCHING CHARACTERISTICS".

FIELD OF THE INVENTION

The present invention relates to signal transmission over conductive structure.

BACKGROUND

It is desirable to convey data signals in a manner that provides relatively high speed while consuming relatively little power. Differential signaling modes such as low voltage differential signaling (LVDS) are used for many such applications. The rejection of common-mode noise inherent in a differential scheme allows for implementations having low power consumption, and the low voltage swing in an LVDS application allows for high-speed transmission. Moreover, drivers for such systems may be implemented in CMOS (complementary metal-oxide-semiconductor or "MOS"), which process provides low static power consumption.

Differential signaling circuits may be used to drive paired or unpaired transmission lines such as twisted pair cable, conductors in ribbon cable, or parallel traces on a circuit board. Differential signaling systems also tend to produce relatively little noise (electromagnetic interference or "EMI") to interfere with other devices or signaling lines. Applications for differential signaling and LVDS include transmission of images (e.g. within a digital camera, or between a camera and a host), transmission of video images (e.g. from a host computer or processor to a display screen (such as within a laptop computer or a flat-panel display device), or over a distance of meters), and other high-speed transmissions of data (e.g. a high-speed disk storage interface).

In summary, a low voltage differential signaling scheme may provide numerous advantages such as reduced power consumption, lower EMI emissions, good rejection on common-mode noise, less expensive cable interface, and simplified transmitter design. FIG. 1 shows a structure of an LVDS input/output interface, which illustrates the low current, low termination impedance, and low voltage swing of such a scheme. Documents that define LVDS transmission schemes include the ANSI/TIA/EIA-644 standard, the IEEE 1596.3 standard (Scalable Coherent Interface LVDS or "SCI-LVDS"), and subsequent revisions thereof.

FIG. 2 shows one implementation of a LVDS driver circuit. In this circuit, N-channel MOS field-effect transistors (FETs) NP1, NP2, NS1, and NS2 are used to switch current through a load R1. In response to the input signals SN and SP changing signal states, these four transistors act as current-steering cells to switch the direction of a driving current (provided by current source CSR1) and offer a differential output signal to the resistive load. Current returning from the load is passed to current sink CSK1.

FIG. 3 shows a circuit including two digital inverters that may be used to generate input signals SN and SP for the circuit of FIG. 2 from a single digital signal.

FIG. 4 shows a diagram of the circuit of FIG. 2 that illustrates how the current source CSR1 and current sink CSK1 have actually been implemented previously (where CMC indicates a current mirroring circuit). In order to maintain a desired offset voltage, the driver circuit of FIG. 4 includes a mimicking circuit consisting of three regulating opamps (X1, X2, and X3); two series resistors R2, R3; and current sourcing and switching transistor cells PC1, NC1.

FIG. 5 shows an alternate LVDS driver circuit in which an offset voltage $V_{off}$ is applied between a pair of series source-termination resistors R4, R5. FIG. 6 shows a circuit that may be used to generate analog differential signals to drive the circuit of FIG. 5, and FIG. 7 shows a diagram of the circuit of FIG. 5 that illustrates how the current source CSP and current sink CSN have actually been implemented previously, using a particular current mirror configuration.

DETAILED DESCRIPTION

The term "exemplary" as used herein indicates an example only, and should not be taken necessarily to indicate a preferred or superior value or instance.

Figure 1:
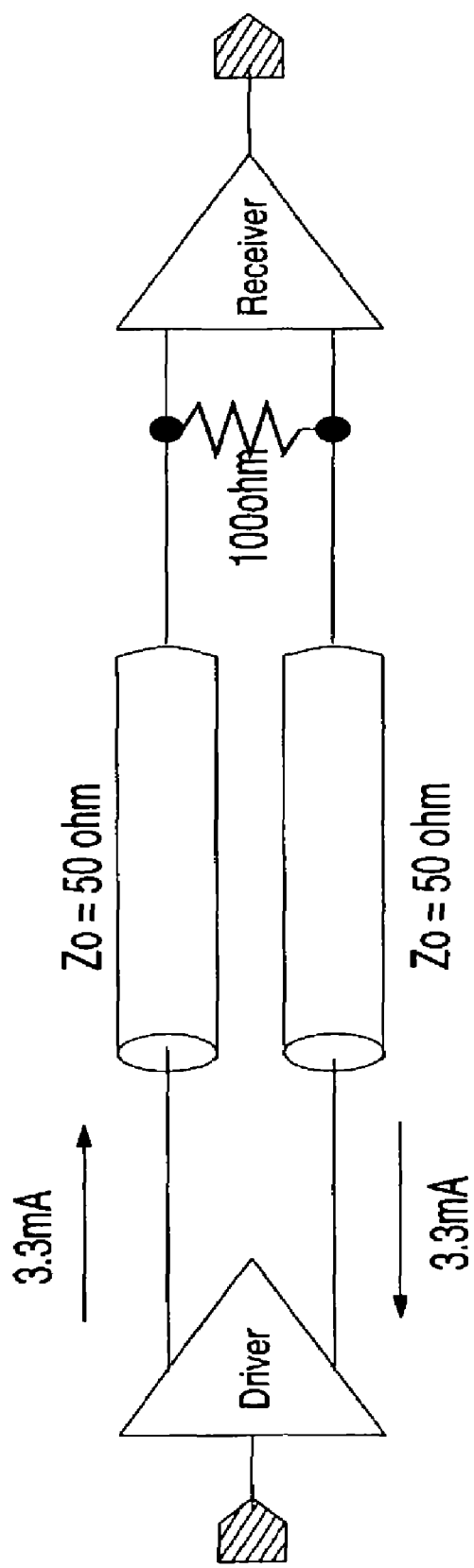
FIG. 1 depicts an example of an LVDS input/output interface.
Figure 2:
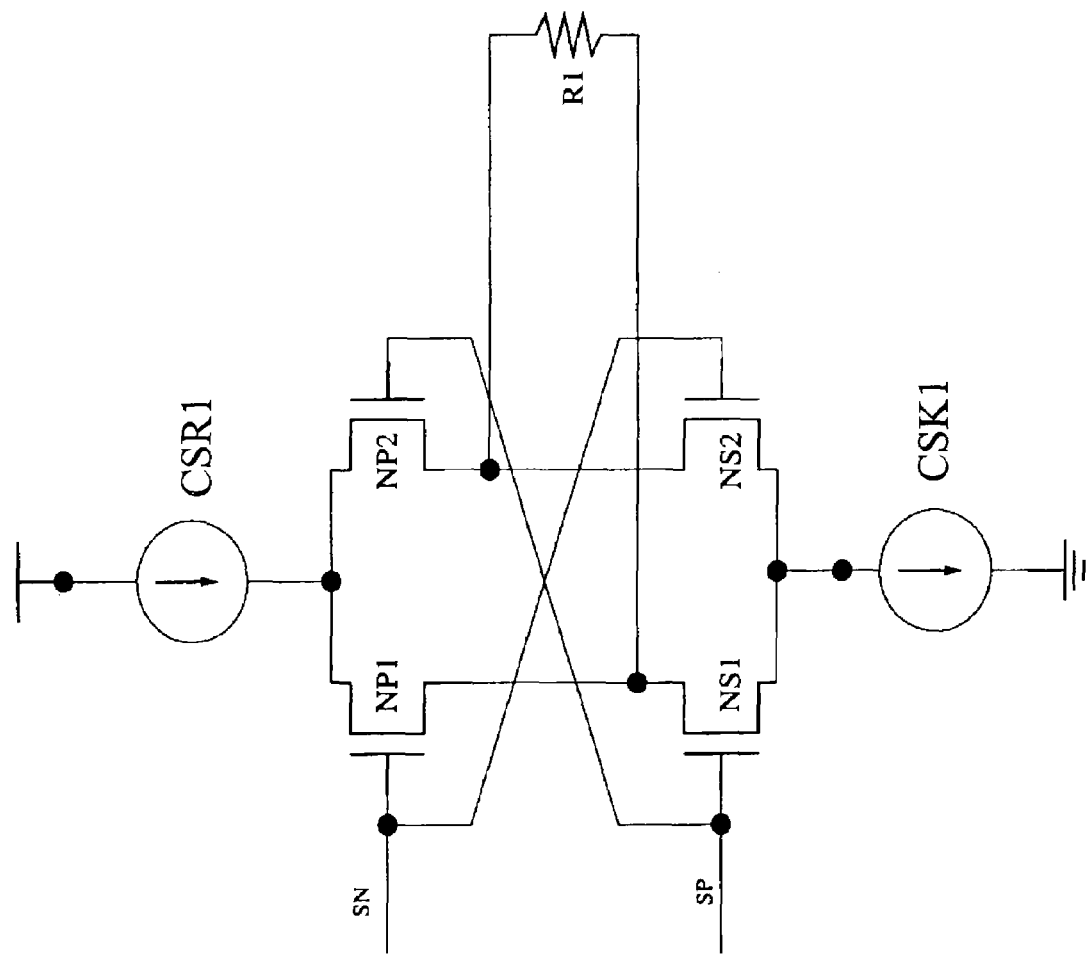
FIG. 2 shows an LVDS driver circuit.
Figure 4:
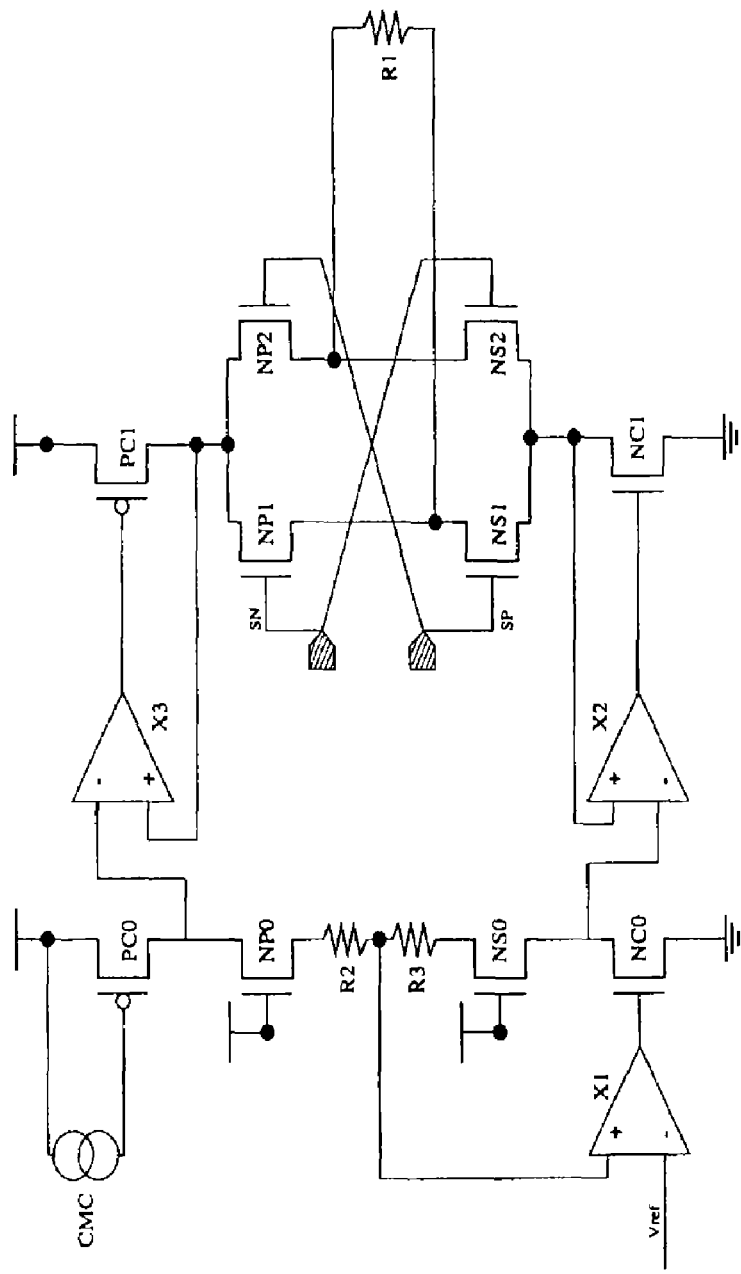
FIG. 4 shows an LVDS driver circuit that includes a mimicking circuit.
Figure 5:
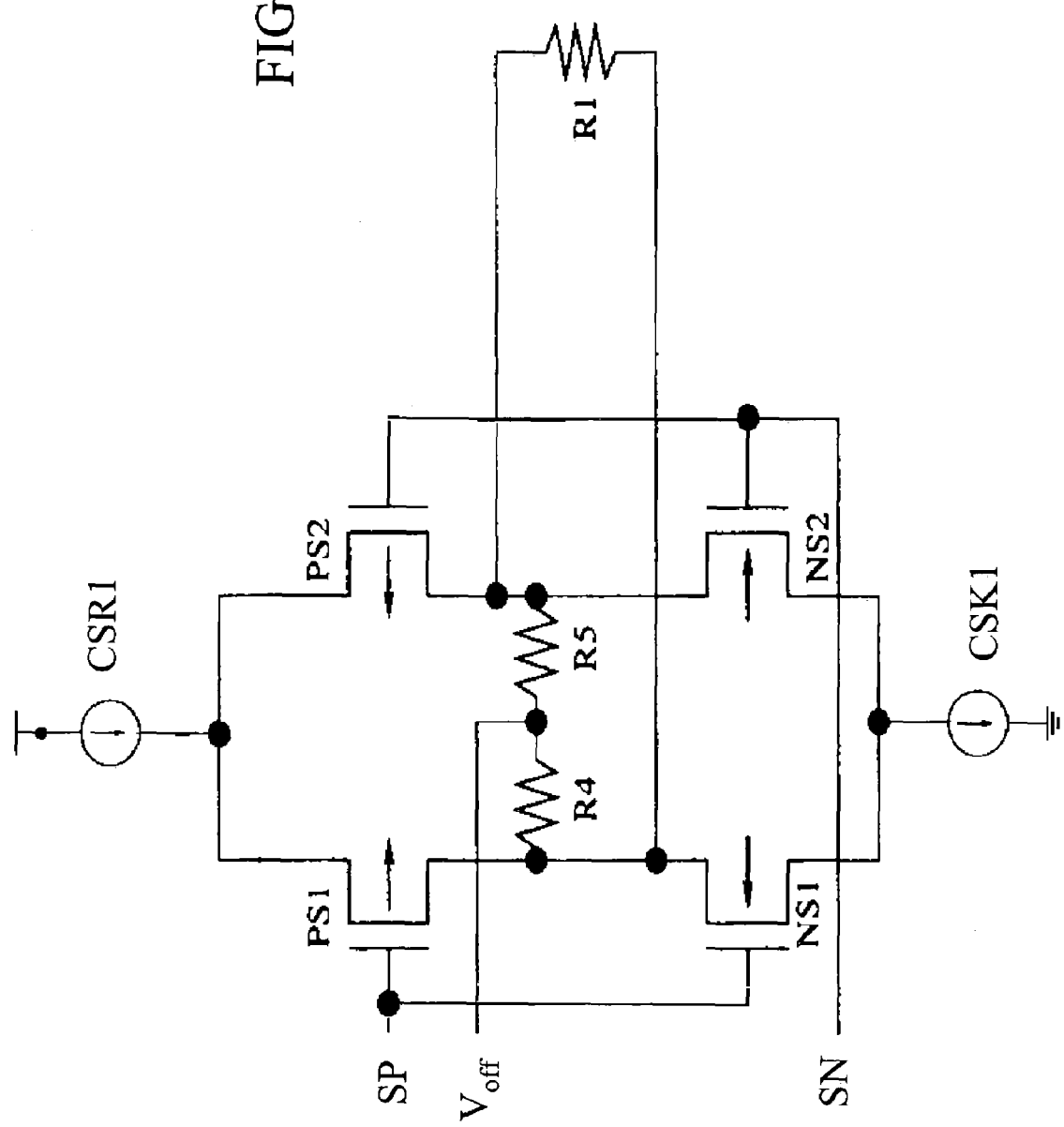
FIG. 5 shows an LVDS driver circuit.

When an LVDS driver circuit as shown in FIG. 2 or FIG. 4 is implemented using N-well processes, the transistors NP1 and NP2 may suffer from body effects. As a consequence, the effective "ON" resistance values for these transistors may be relatively high compared to those of similarly configured PMOS transistors with comparable sizes. The resulting voltage drops across transistors NP1 and NP2 may force the minimum required value for the power supply potential ($V_{DD}$) to be higher than desired.

Another drawback of an LVDS driver circuit as shown in FIG. 4 may arise from offsets inherent in the feedback loops of the opamps X2 and X3. As a consequence of these offsets, matching the "mimicking" transistor PC0 to current source PC1, and matching the "mimicking" transistor NC0 to current sink NC1, may not be enough to ensure a matching between the current passed to current sink NC1 and the current provided by current source PC1. Rather, the current flowing out of the positive terminal of the driver to the load (and the current flowing into the negative terminal of the driver from the load) may be defined by the "ON" resistance values of the current-switching transistors NP1, NP2, NS1, NS2 and the resistance value of the load R1. Therefore, the circuit may be susceptible to a large variation of the voltage drop across R1 when there are mismatches between "mimicking" transistor NP0 and either of current-switching transistors NP1 and NP2, or between "mimicking" transistor NS0 and either of current-switching transistors NS1 and NS2.

Figure 3:
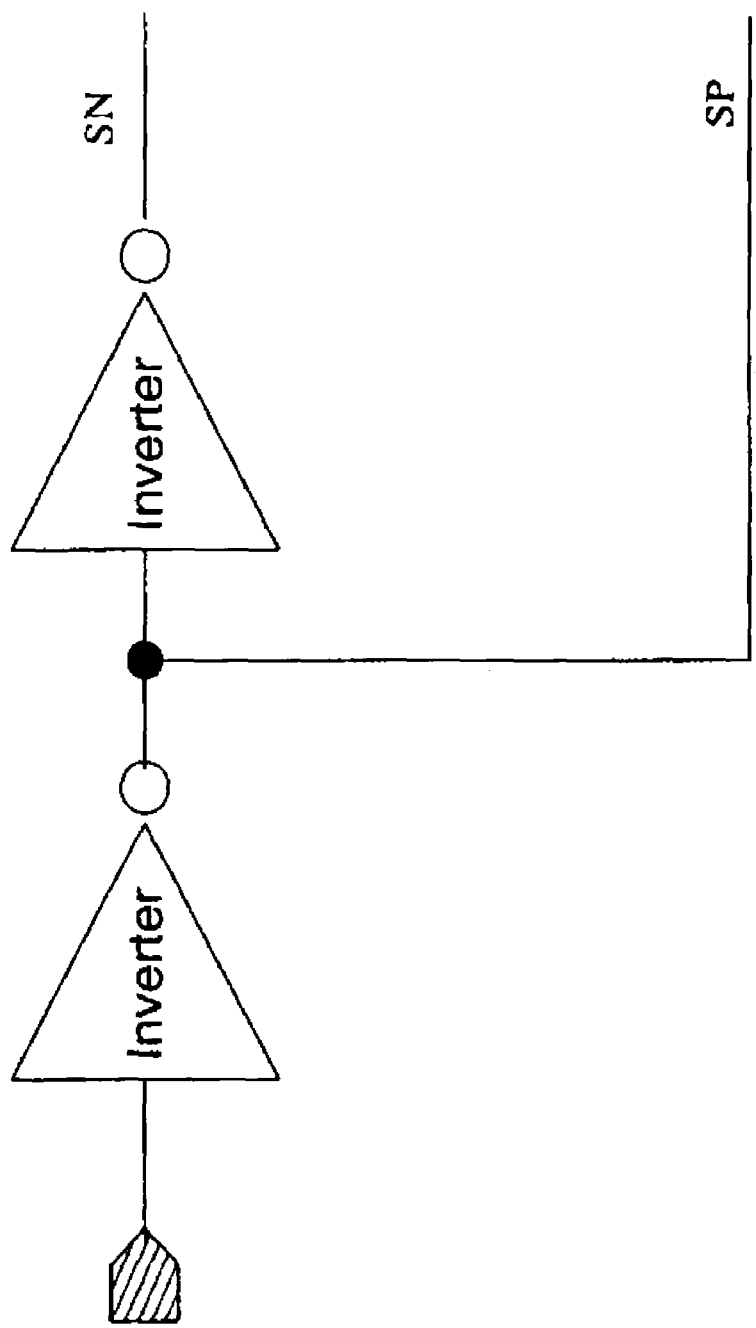
FIG. 3 shows a digital control circuit for use with the driver circuit of FIG. 2.

In addition, a driver using a conventional single-ended digital control circuit as shown in FIG. 3 may suffer from timing distortion due to mismatched rising and falling times of the SN and SP signals applied to the driver inputs.

Figure 6:
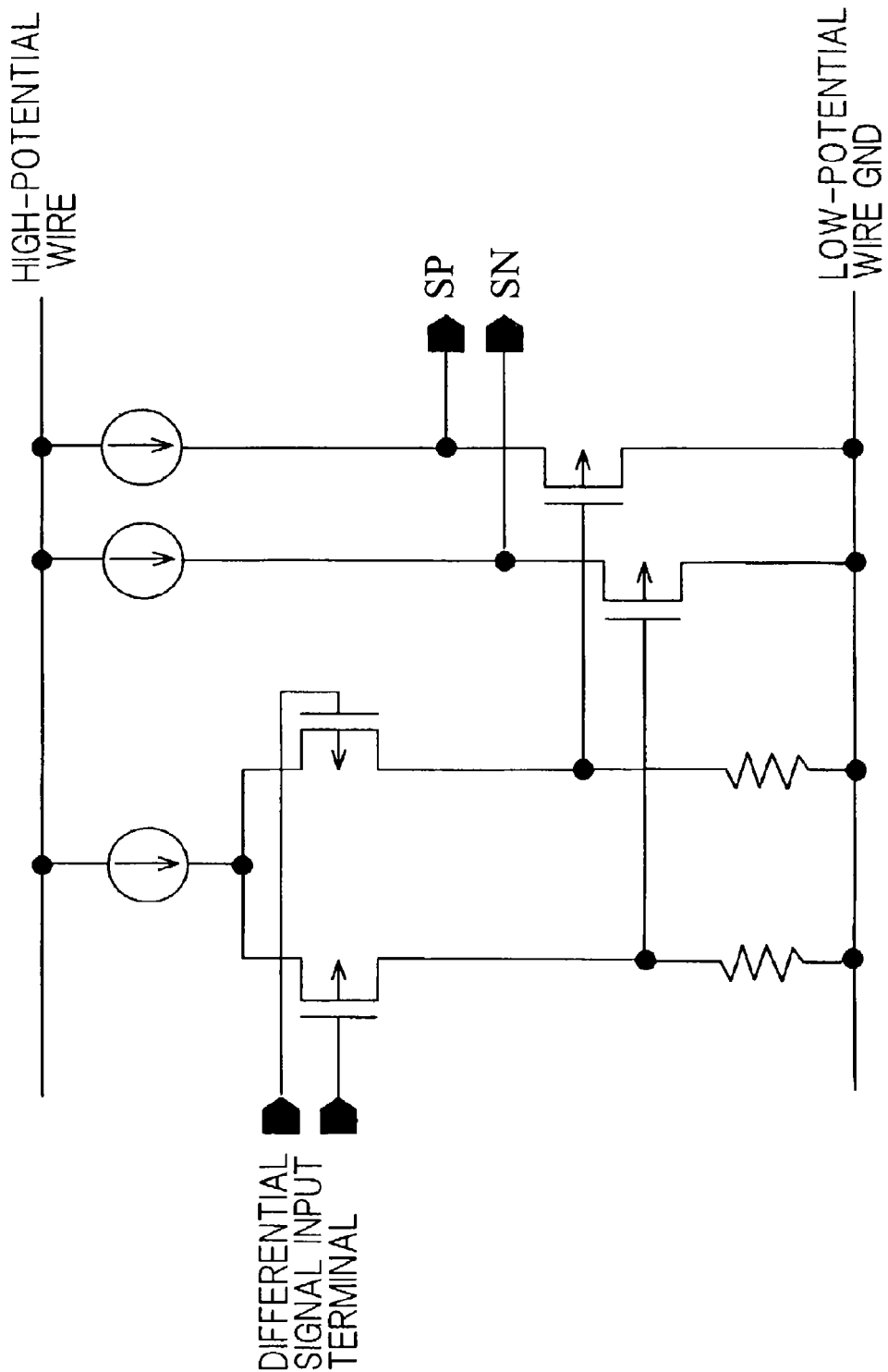
FIG. 6 shows an analog differential control signal generator for use with the driver circuit of FIG. 5.
Figure 7:
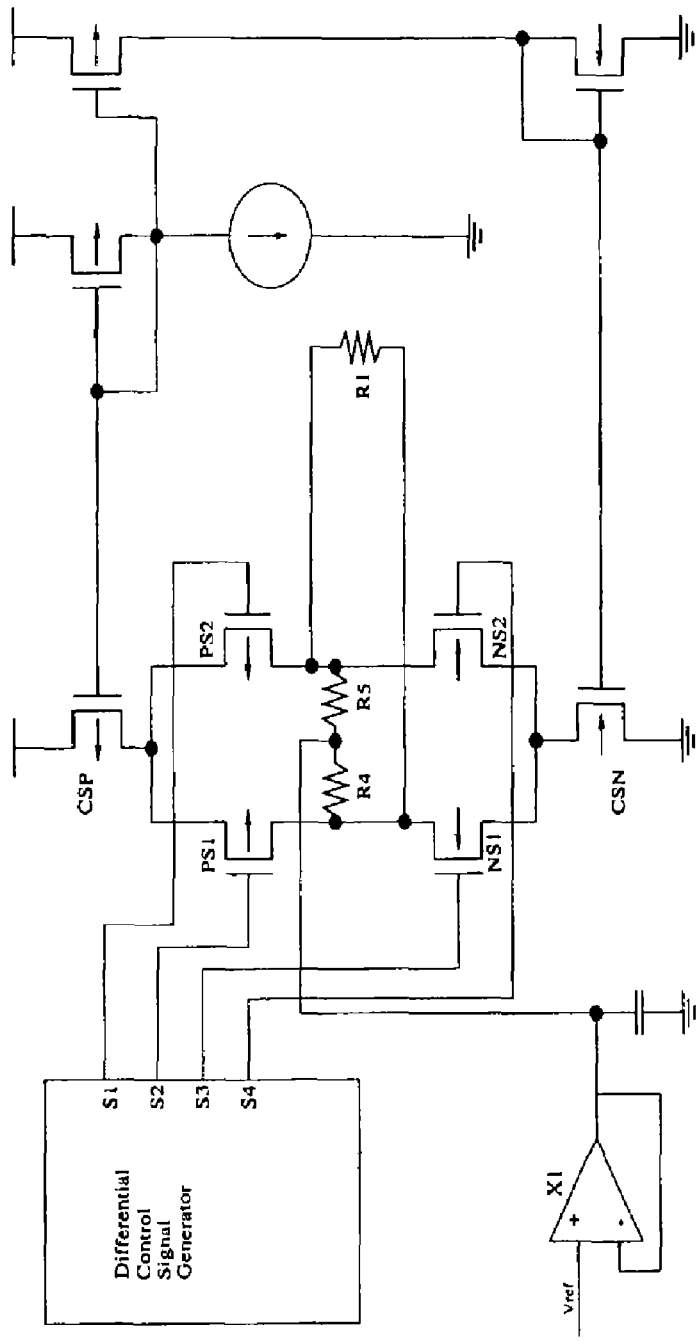
FIG. 7 shows an implementation of the driver circuit of FIG. 5.

FIG. 7 illustrates another LVDS driver circuit. Instead of utilizing a mimicking circuit, a driver circuit as shown in FIG. 7 attempts to set an output common-mode voltage directly, using two resistors R4 and R5 and a voltage regulator X1. The control signals applied to the driver are analog signals provided by a differential control signal generator as shown, e.g., in FIG. 6 (in this case, SP=S2,S3 and SN=S1,S4).

In order to reduce power consumption in the circuit of FIG. 7 and to reduce loading of load R1, it may be desirable to implement R4 and R5 using relatively large values of effective resistance (i.e. in comparison to the effective resistance value of R1). However, although the output common-mode voltage of this circuit may be well-defined when all of the current-switching transistors (PS1, PS2, NS1, NS2) are off, the driver may experience a problem (e.g. the actual output common-mode voltage may vary) when DC (direct current) resistance values of R4 and R5 are larger than either that of the current source CSP or that of the current sink CSN. Such a situation may occur, for example, when (1) there is a current mismatch between current source CSP and current sink CSN and (2) current source CSP and current sink CSN are short-channel current sources.

Figure 8:
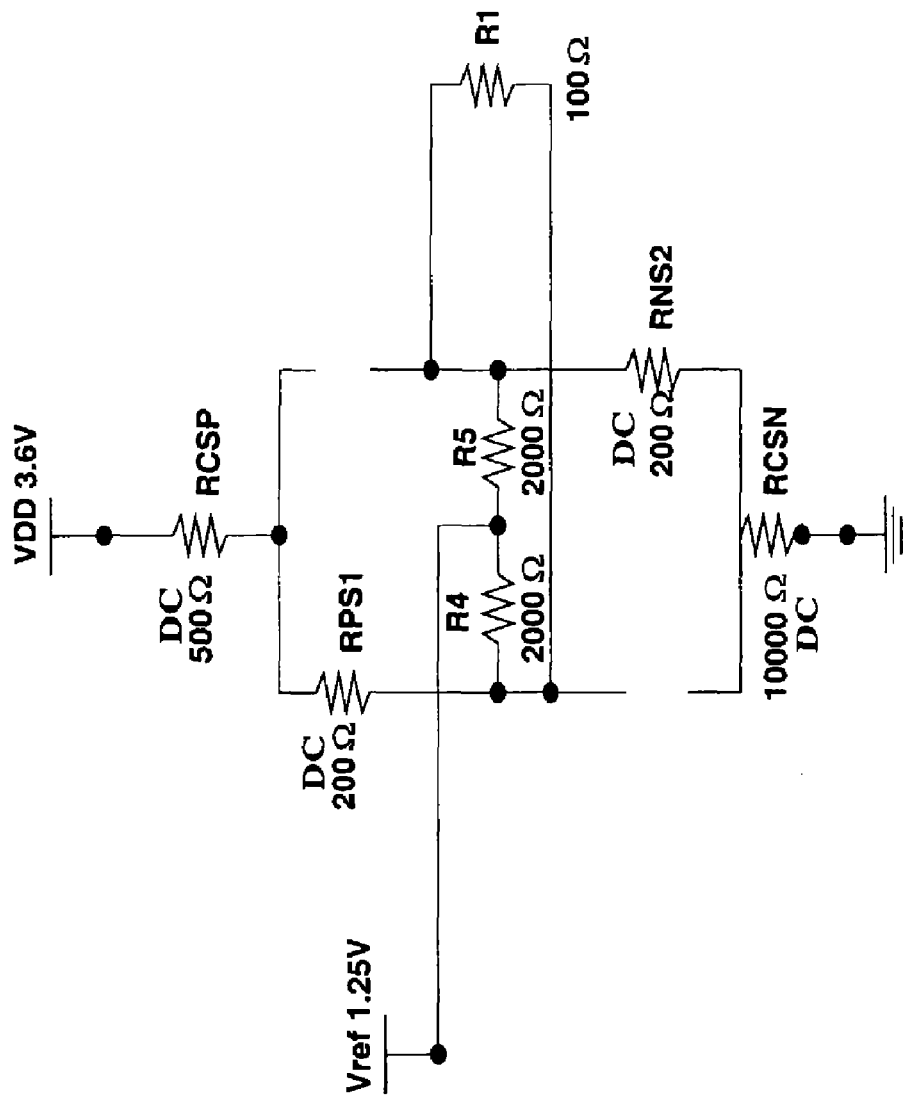
FIG. 8 shows a model of the driver circuit of FIG. 7.

FIG. 8 demonstrates an example of FIG. 7 in which specific exemplary values of effective resistances for various elements are shown. In this example, one may appreciate that the actual output common-mode voltage is set not only by the reference potential $V_{ref}$, but by the rail potential $V_{DD}$ as well. In order to reduce the effect of $V_{DD}$ or $V_{GND}$ on the output common-mode voltage in such a circuit, the resistance values of R4 and R5 must be reduced, which condition may cause loading of the output resistance R1 and/or increased power consumption by the driver circuit. Additionally, reducing the resistances of R4 and R5 may cause an increase in current flow through R4 and R5. Such a situation may require R4 and R5 to be wider in order to handle the increase in current flow, thus leading to an increase in chip area.

Some of the embodiments of the invention as disclosed herein may be applied to address one or more of the problems described above. The solution of such problems should not be taken as a feature, object, or other limitation of the invention, however. Embodiments of the invention may be applied regardless of the presence or solution of any such problems, and the scope of the invention is defined only by the claims of this patent as issued.

Figure 9:
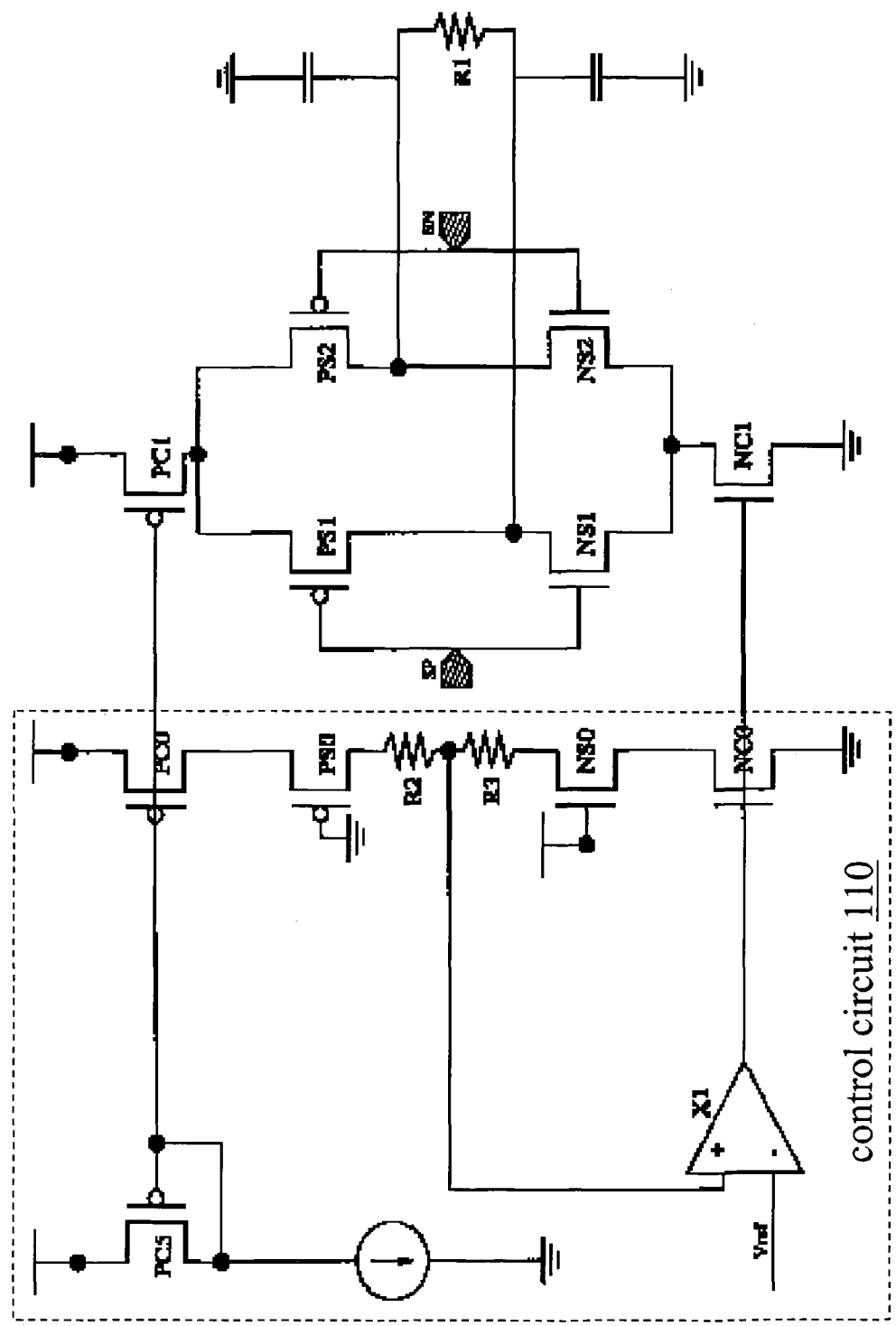
FIG. 9 shows a circuit according to an embodiment of the invention.

FIG. 9 shows a schematic diagram of a driver circuit according to an embodiment of the invention that utilizes PMOS (PS1, PS2) and NMOS (NS1, NS2) transistors. In an exemplary embodiment, the bodies of these four transistors are connected to the respective power supply rails as switches (i.e. the bodies of PS1 and PS2 being connected to $V_{DD}$, and the bodies of NS1 and NS2 being connected to $V_{SS}$). It may also be desirable for transistors PS1 and PS2 to be matched, and for transistors NS1 and NS2 to be matched.

The driver circuit also includes a biasing or control circuit 110. This circuit includes transistors PC0 and NC0, which replicate current-sourcing transistor PC1 and current-sinking transistor NC1, respectively; transistors PS0 and NS0, which replicate current-switching transistors PS1/2 and NS1/2, respectively; and resistances R2 and R3, which in series replicate load R1, and at whose junction an offset voltage $V_{off}$ is defined.

As a result of the duplicated current path, current flowing through PC0 is equal to that through NC0, and thus current through PC1 matches that through NC1. In other words, the current flowing out of the positive terminal of the driver to the load R1 matches the current flowing into the negative terminal from the load R1, thus generating less EMI. For this driver, output common-mode voltage is well-defined by the duplicated current path (PC0, PS0, R2, R3, NS0, NC0) and a comparator (the feedback opamp X1). Opamp X1 compares a reference voltage $V_{ref}$ to the offset voltage $V_{off}$ and biases the current-sinking transistors NC0, NC1 to maintain the equivalence of these voltages. Opamp X1 may receive the reference voltage $V_{ref}$ from a node external to (or otherwise independent of) the current paths of the driver circuit. For example, opamp X1 may receive this potential from a reference circuit such as a bandgap reference generator. Opamp X1 may be transconductive such that the offset voltage node is not thereby loaded. Thus an implementation of a circuit as shown in FIG. 9 may be applied to ensure that both the offset voltage $V_{off}$ and the value of the output common-mode voltage are equal to the reference voltage $V_{ref}$.

Figure 10:
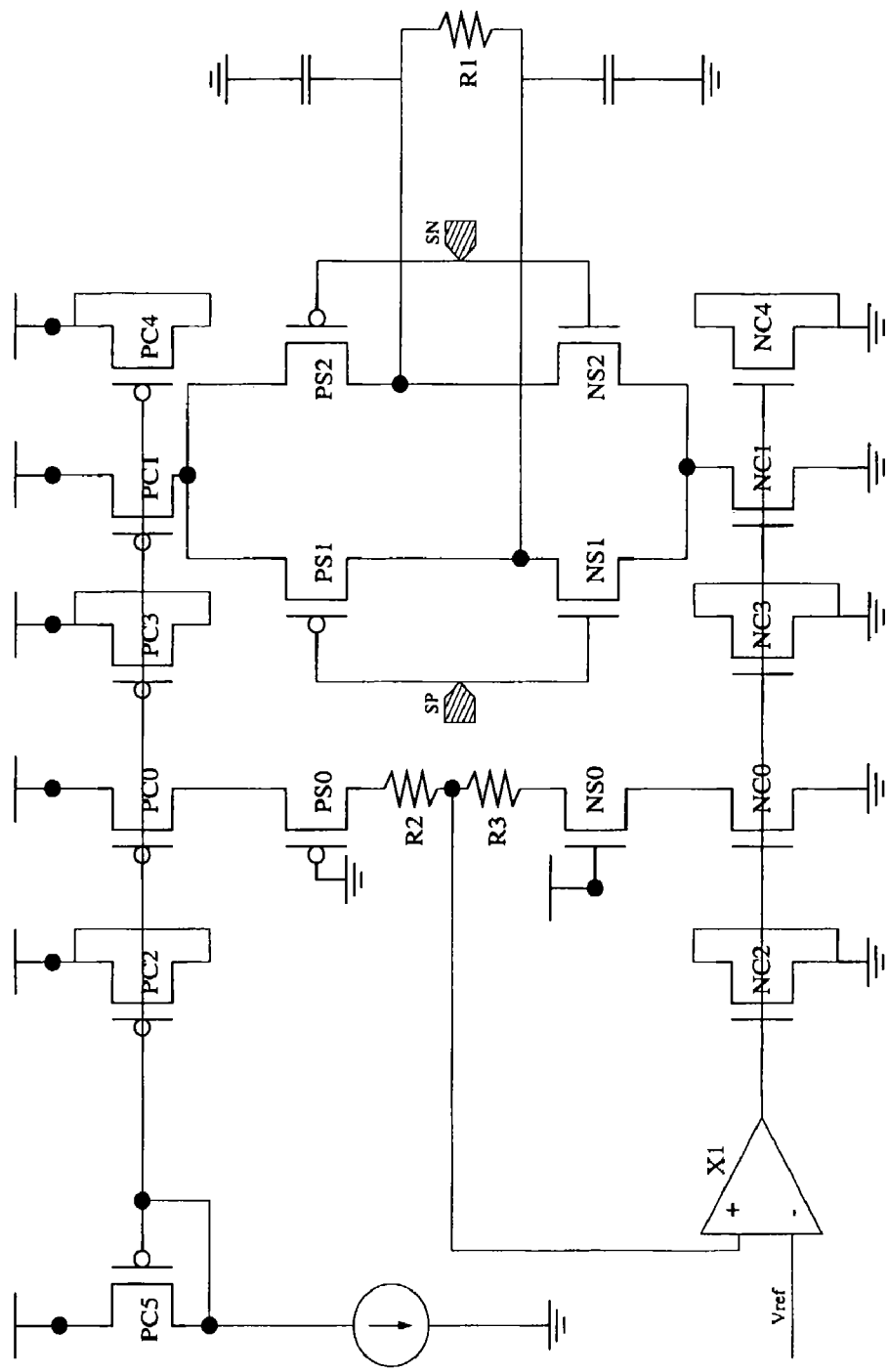
FIG. 10 shows an implementation of the circuit of FIG. 9.

It may be desirable for transistors PC0 and PC1 to be well-matched. Likewise, it may be desirable for transistors NC0 and NC1 to be well-matched. Uniformity between a pair of nearby circuit elements may be enhanced (e.g. during an etching process) by fabricating one or more dummy elements between them. Therefore, matching of transistors (e.g. PC0 to PC1, and NC0 to NC1) in the circuit of FIG. 9 may be enhanced by adding dummy transistors between and/or around these transistors during fabrication. FIG. 10 depicts an implementation of the driver circuit of FIG. 9 that includes dummy cells NC2, NC3, NC4, PC2, PC3 and PC4 that are fabricated side-by-side between and around NC0 and NC1 and between and around PC0 and PC1.

In another implementation, dummy cells may be used to enhance matching between current-switching transistors PS1 and PS2, and/or between current-switching transistors NS1 and NS2. However, it should be noted that adding dummy elements reduces available chip area (or, conversely, increases circuit size).

In a further implementation of a driver circuit as shown in FIG. 9 or FIG. 10, the replicate transistors PC0, PS0, NS0, and NC0 are implemented such that their channel width values are a common fraction (1/K) of the respective one of transistors PC1, PS1, NS1 and NC1. In this case, the resistance value of (R2+R3) is implemented to be a common multiple (K) of that of R1. To ensure that the duplicated current flowing through PC0 and NC0 is substantially equal to a fraction (1/K) of the drive current through PC1 and NC1, dummy cells as described above may be placed side-by-side of, e.g., transistors PC0 and PC1 and/or transistors NC0 and NC1.

In such an implementation, it may be desirable for one of more of the dimensions of each dummy transistor to match the respective dimensions of the adjacent transistor. In a case where the dummy cell is between two transistors of different dimensions, it may be desirable for one or more of the dimensions of the dummy cell to be one of the arithmetic or geometric mean of the respective dimensions of the surrounding transistors. Alternatively, dimensions of dummy cells that alternate in position with current-carrying transistors may be selected to satisfy or approximate a particular arithmetic or geometric progression in conjunction with those of the current-carrying transistors.

Resistances R2, R3 may be implemented as resistors or as active elements (e.g. MOSFETs) connected to provide fixed (or alternatively, controllable and/or compensating) resistances. Typically R2 and R3 will be implemented to have equal resistances, although other implementations are also possible. In an alternate implementation of a circuit as shown in FIG. 9 or FIG. 10, a chip embodying the other elements of the illustrated driver circuit (or only those of the biasing or the current-switching current path) includes pins to which external resistances may be coupled (and, e.g., selected and changed as desired) to serve as the resistances R2, R3.

As shown in FIGS. 9 and 10, transistor PC5 is coupled to transistors PC0 and PC1 (and possibly to dummy cells) in a current mirror configuration. Other known current mirror configurations may also be used, such as a cascode, Wilson, or modified Wilson current mirror (e.g. as are shown in the text *Microelectronic Circuits* by Sedra and Smith, 3$^{rd}$ ed. 1991, Oxford Univ. Press).

Figure 11:
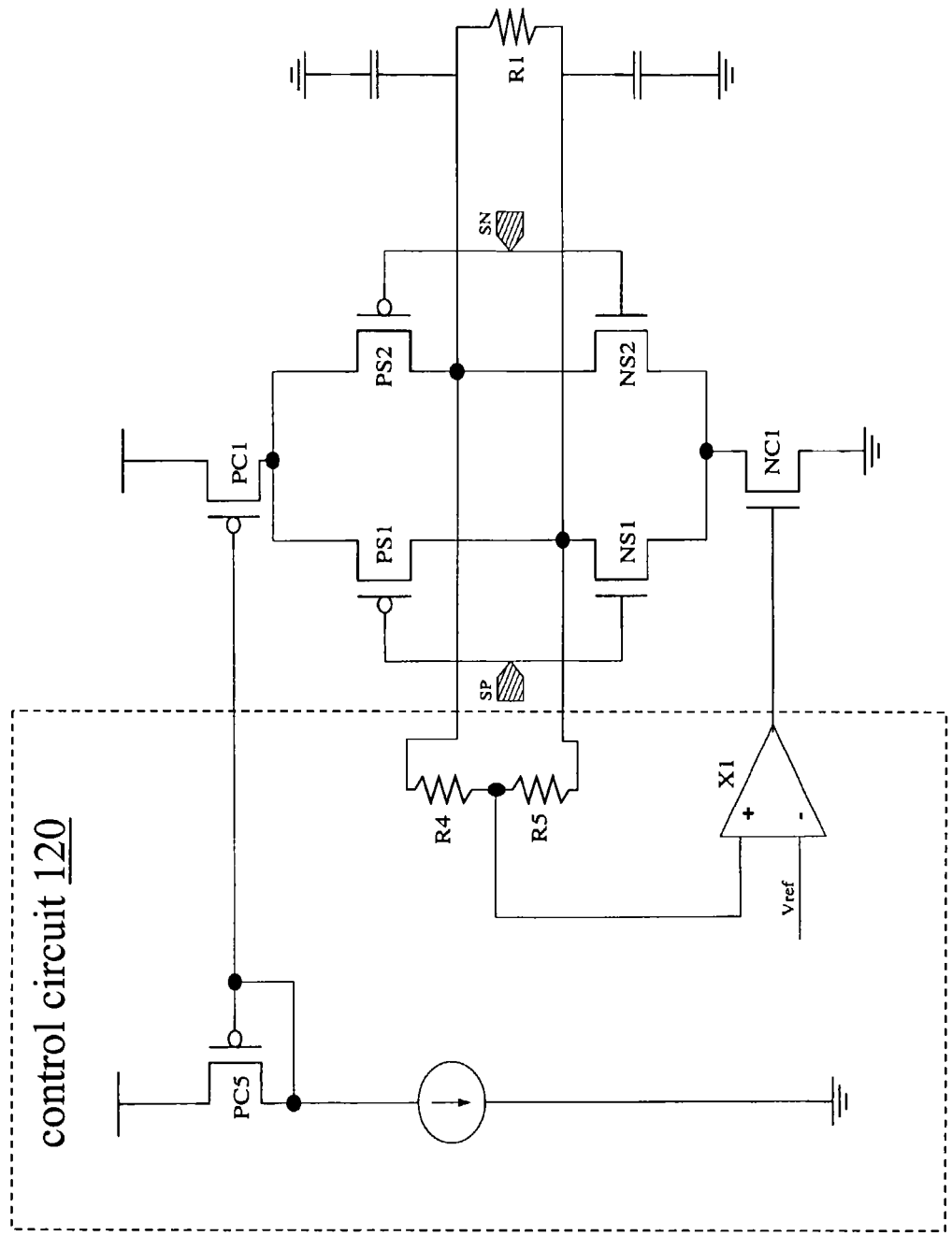
FIG. 11 is a block diagram of an output driver topology according to an alternative embodiment of the present invention.

FIG. 11 illustrates a driver circuit according to another embodiment of the invention that includes a control circuit 120. This driver circuit includes two pairs of PMOS (PS1, PS2) and NMOS (NS1, NS2) switches whose bodies may be tied to the positive and negative power supply rails, respectively. This circuit may be implemented such that current source transistor PC1 sources a drive current that is equal to the current of current sink transistor NC1 in order to establish a desired differential output voltage across resistive load R1.

Instead of using a duplicated biasing circuit (e.g. a mimicking circuit as in FIG. 4 or a control circuit as in FIG. 9) to define the output common-mode voltage, control circuit 120 of FIG. 11 uses a feedback loop including series source-termination resistances R4, R5 and a comparator (here, an operational amplifier X1) to bias current sink transistor NC1. In at least some implementations of this circuit, the sizes of R4 and R5 may be as large as desired, e.g. in order to reduce loading of load resistance R1. Typically R4 and R5 will be implemented to have equal resistances, although other implementations are also possible. A circuit as shown in FIG. 11 may also be implemented to have a reduced power consumption as compared to a circuit as shown in FIG. 4 or FIG. 9 due to a lack of a duplicated biasing circuit.

Opamp X1 is configured to compare a voltage reference $V_{ref}$ and an observed common-mode voltage. Opamp X1 may receive the reference voltage $V_{ref}$ from a node external to (or otherwise independent of) the current path of the driver circuit. For example, opamp X1 may receive this potential from a reference circuit such as a band gap reference generator. Opamp X1 may be transconductive such that the observed voltage node is not loaded. Consequently, operational amplifier X1 regulates the voltage at the node between R4 and R5 to the output voltage reference $V_{ref}$, setting the output common-mode voltage indirectly via control of current sink NC1. By virtue of the feedback loop formed by X1, NC1, NS1/NS2, R4 and R5, the circuit of FIG. 11 may be implemented such that the current passing to current sink NC1 is automatically maintained to be equal to the current received from current source PC1.

Transistor PC5 may be substituted with another current mirror configuration as described above. Likewise, dummy cells may be added as described above to improve matching between pairs of the current-switching transistors (e.g. PS1 and PS2).

Figure 12:
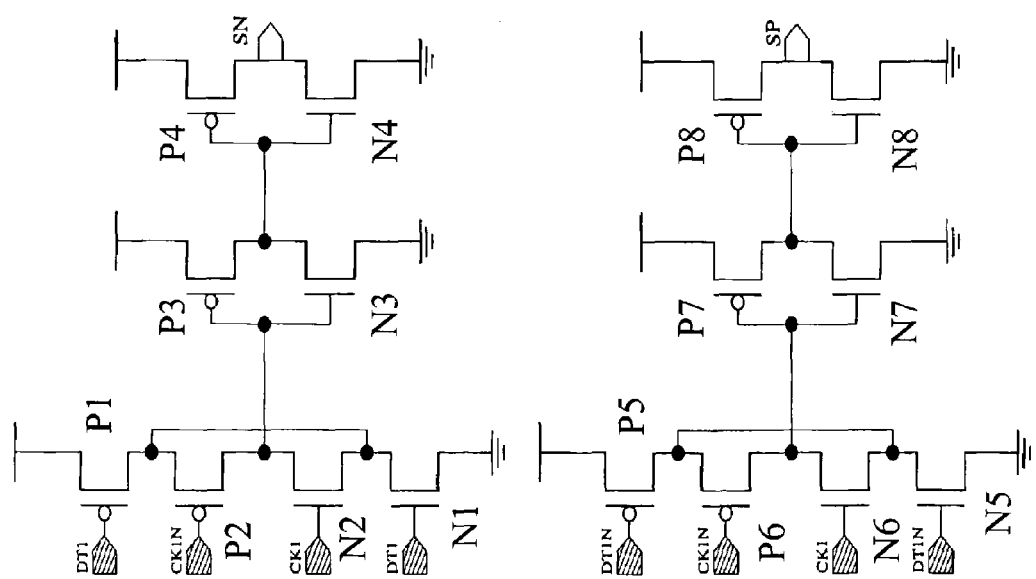
FIG. 12 illustrates a signal generator circuit according to an embodiment of the present invention.

The current-switching transistors PS1, NS1, PS2 and NS2 shown in FIGS. 9, 10 and 11 are controlled by input signals SN and SP applied to their gate terminals (or "control electrodes"). These input signals SN and SP may be complementary rail-to-rail signals provided by a symmetrical control signal generator as shown in FIG. 12. The method that an input data signal DT1 and a complementary signal DT1N are both sampled by the same clock signal CK1 and the same complementary signal CK1N ensures that the output signals SP and SN have equivalent rising times and equivalent falling times. (Each of the complementary signals DT1N and CK1N may be derived by, e.g., passing the corresponding one of signals DT1 and CK1 through a digital inverter.) As such, the pulse width of a driver circuit as shown in FIGS. 9, 10 and 11 is preserved.

FIG. 12 shows a circuit including two identical control cells that may be used to provide rail-to-rail control signals to a driver circuit as described herein (e.g. as shown in FIG. 2, 4, 5, 7, or 9-11). These control cells do not suffer from duty cycle distortion due to rising and falling time mismatches. As long as there is a symmetrical layout for the two identical rail-to-rail control cells depicted in FIG. 12, the circuit may be implemented to produce signals SP and SN having equivalent rising times and equivalent falling times such that the output driver's pulse width for on and off signals is preserved.

Such a circuit may be operated even in the case where complementary signal DT1N is delayed with respect to data signal DT1, or where complementary signal CK1N is delayed with respect to clock signal CK1. Even in this case, so long as the elements of the two control cells are matched, the circuit may be implemented such that the signals SP and SN have equivalent rising times and equivalent falling times.

Figure 13:
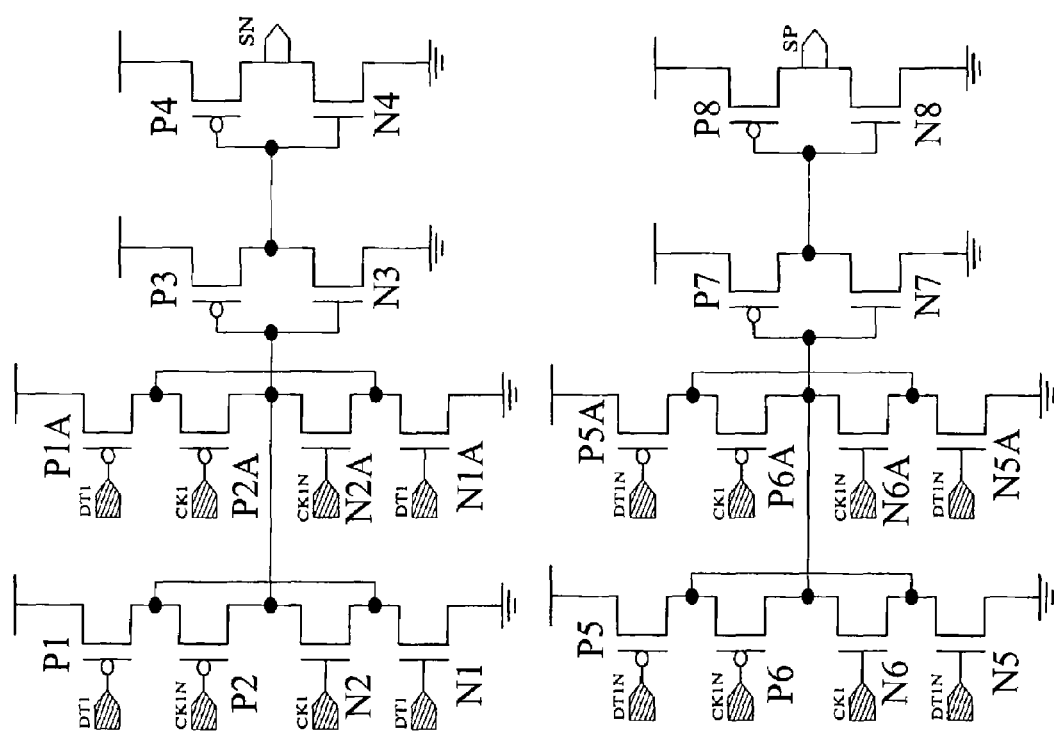
FIG. 13 shows an implementation of the circuit of FIG. 12.
Figure 14:
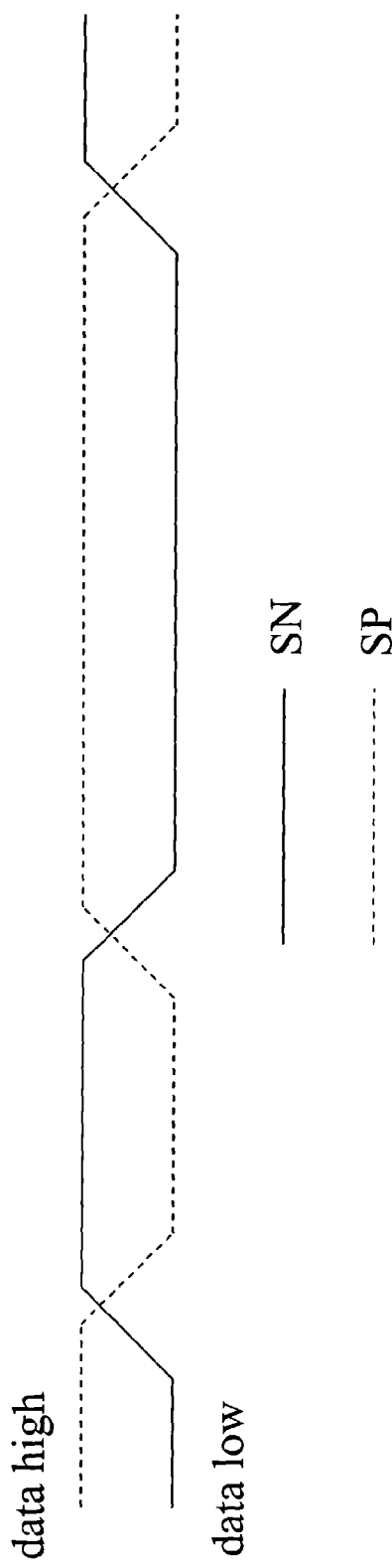
FIG. 14 shows a timing diagram for the circuit of FIG. 13.

In the circuit of FIG. 12, it is possible that the gates of transistors P3, N3, P7, and N7 may be in a floating state when signal CK1 is low (i.e. when the analog switches P2/N2 and P6/N6 are in an open state). Such a condition may lead to the inverters P31N3 and P7/N7 having an unstable or wasteful operation. FIG. 13 shows another implementation of this circuit that may be used to avoid such a condition. This implementation includes analog switches P2A/N2A and P6A/N6A that are in a closed state when the analog switches P2/N2 and P6/N6 are in an open state, and vice versa. Therefore, a floating-gate condition of transistors P3, N3, P7, and N7 may be avoided. FIG. 14 shows one example of a timing diagram for such a circuit in which signal CK1N is delayed with respect to signal CK1. In particular, this example shows two data value changes between adjacent clock cycles, followed by no data value change between adjacent clock cycles, followed by another data value change. It may be seen that regardless of the incoming data values, the signals SP and SN have equivalent rising times and equivalent falling times.

Figure 15:
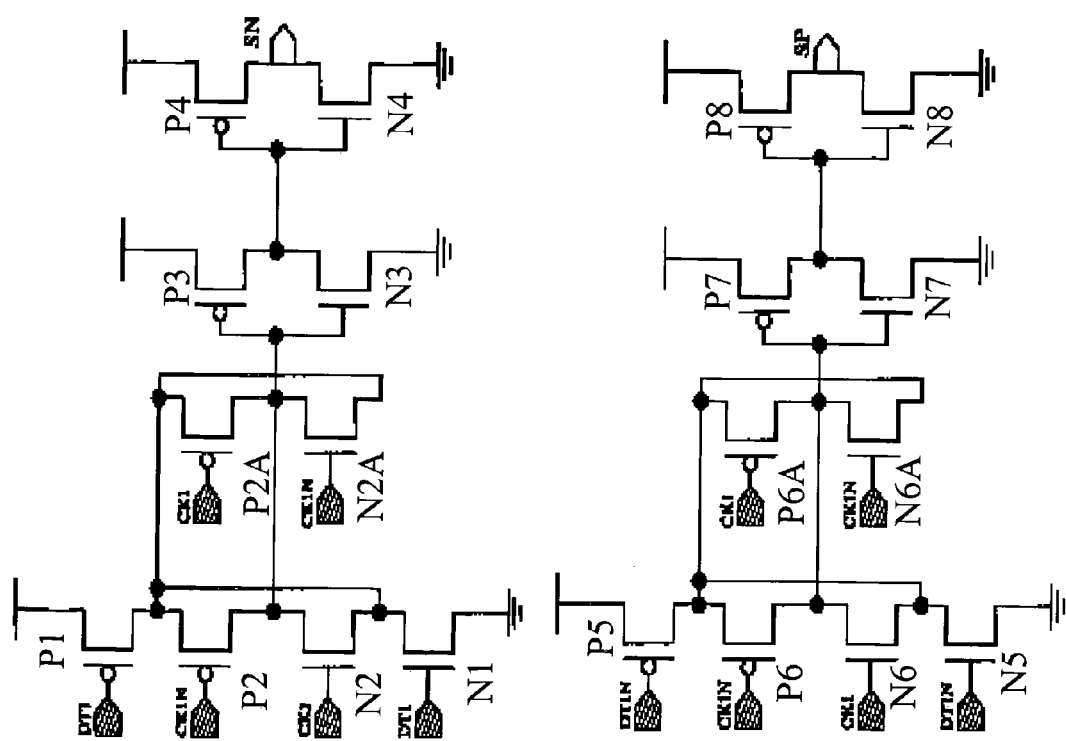
FIG. 15 shows an implementation of the circuit of FIG. 13.

FIG. 15 shows a variation of the circuit of FIG. 13 in which the inverters P1A/N1A and P5A/N5A are omitted. Such a circuit may be applied in cases where the increased load on inverters P1/N1 and P5/P5 is acceptable. Additionally, it may be acceptable in some applications of a circuit as shown in FIG. 12, 13, or 15 to obtain the output signals directly from the output terminals of the analog switches (i.e. the drain terminals of P2/N2 and P6/N6), although such signals may not be strictly rail-to-rail. In such a case, the inverters P3/N3, P4/N4, P7/N7, and P8/N8 may be omitted.

The operation of output drivers and the control circuit in accordance with certain embodiments of the present invention may result in several advantages over conventional output drivers and control circuits. As mentioned above, a match between the current flowing out of the positive terminal of a driver circuit as shown in FIGS. 9, 10 and the current flowing into negative terminal may result in reduced EMI emissions. This match of current values may be attributed to both the feedback loop and dummy cells shown in FIGS. 9, 10. The topology used in FIG. 11 ensures a defined output common-mode voltage as well without resorting to extra duplicated transistors and dummy cells and thus consumes less power. Unlike a circuit as shown in FIG. 4, the values of R4 and R5 in a driver circuit as shown in FIG. 11 can be as large as possible in order not to load the output resistor R1. Consequently, such a circuit may be implemented in a smaller circuit area. On the other hand, two identical rail-to-rail control cells as depicted in FIGS. 12, 13, and 15 may be used to drive the input of a driver circuit as shown in either FIG. 9, 10 or 11 such that the output signals do not suffer from duty cycle distortion due to rising and falling time mismatches, as opposed to a control circuit as shown in FIG. 3. As noted above, however, such potential advantages of particular embodiments or implementations are not to be taken as requirements or limitations of the invention as a whole, whose scope is defined only by the claims as issued. Moreover, in some cases (e.g. instances in which MOS devices are not specifically claimed) the invention may be implemented using active elements (e.g. bipolar transistors, heterojunction devices, metal-insulator-semiconductor FETs (MISFETs), and/or other current-controlling devices) other than those explicitly illustrated or mentioned herein.

What is claimed is:

1. A circuit for signal transmission, said circuit comprising:
    a current source;
    a current sink having a current control terminal;
    a current steering circuit having a pair of output nodes, said current steering circuit being arranged to receive current from the current source and to pass current to the current sink, and said current steering circuit being configured to provide a differential signal to a load connected across the output nodes; and
    a control circuit including a voltage regulator, said voltage regulator being configured to produce a regulated voltage based on a comparison between a reference voltage and an offset voltage,
    wherein the current control terminal of the current sink is arranged to receive the regulated voltage.

2. The circuit for signal transmission according to claim 1, wherein the current steering circuit includes two switches, each switch having an input node and one of the pair of output nodes and being configured to provide current to the respective output node or to receive current from the output node according to a potential at the input node.

3. The circuit for signal transmission according to claim 2, wherein each switch of the current steering circuit includes a first transistor and a second transistor, and
    wherein the first transistor of each switch is configured and arranged to conduct current in response to a high potential at the respective input node and to be substantially nonconductive in response to a low potential at the respective input node, and
    wherein the second transistor of each switch is configured and arranged to conduct current in response to a low potential at the respective input node and to be substantially nonconductive in response to a high potential at the respective input node.

4. The circuit for signal transmission according to claim 2, wherein each switch of the current steering circuit includes a first transistor and a second transistor, and
    wherein each first transistor is a PMOS transistor and each second transistor is an NMOS transistor.

5. The circuit for signal transmission according to claim 4, wherein each of the first transistors is arranged to receive current from the current source, and wherein each of the second transistors is arranged to pass current to the current sink.

6. The circuit for signal transmission according to claim 1, the control circuit further comprising a transistor coupled to a current control terminal of the current source in a current mirror configuration.

7. The circuit for signal transmission according to claim 1, wherein the voltage regulator is an operational amplifier.

8. The circuit for signal transmission according to claim 1, the control circuit further comprising a pair of resistances in series, wherein the voltage regulator is arranged to obtain the offset voltage from the junction between the pair of resistances.

9. The circuit for signal transmission according to claim 1, wherein each exterior node of the pair of resistances is conductively coupled to a respective one of the output nodes of the current steering circuit.

10. The circuit for signal transmission according to claim 1, the control circuit further comprising a replicated current sink having a current control terminal conductively coupled to the current control terminal of the current sink, and a replicated current source.

11. The circuit for signal transmission according to claim 10, the control circuit further comprising a transistor coupled to a current control terminal of the current source in a current mirror configuration.

12. The circuit for signal transmission according to claim 10, wherein the voltage regulator is an operational amplifier.

13. The circuit for signal transmission according to claim 10, wherein the replicated current source has a channel width that is smaller than a channel width of the current source by a first proportion, and
    wherein the replicated current sink has a channel width that is smaller than a channel width of the current sink by the first proportion.

14. The circuit for signal transmission according to claim 10, wherein said circuit includes at least one dummy transistor,
    wherein said at least one dummy transistor is located at a position taken from the group consisting of beside the current source, beside the current sink, beside the replicated current source, beside the replicated current sink, between the current source and the replicated current source, and between the current sink and the replicated current sink.

15. The circuit for signal transmission according to claim 10, the control circuit further comprising a first replicated current-switching transistor and a second replicated current-switching transistor, wherein the first replicated current-switching transistor is arranged to receive current from the replicated current source and the second replicated current-switching transistor is arranged to pass current to the replicated current sink.

16. The circuit for signal transmission according to claim 15, wherein the first replicated current-switching transistor is a PMOS transistor, and wherein the second first replicated current-switching transistor is a NMOS transistor.

17. The circuit for signal transmission according to claim 15, the control circuit further comprising a pair of resistances in series, wherein the first replicated current-switching transistor is conductively coupled to one exterior node of the pair of resistances, and wherein the second replicated current-switching transistor is conductively coupled to the other exterior node of the pair of resistances.

18. The circuit for signal transmission according to claim 17, wherein the voltage regulator is arranged to obtain the offset voltage from the junction between the pair of resistances.

* * * * *